US012590995B2

(12) United States Patent
Kim et al.

(10) Patent No.: US 12,590,995 B2
(45) Date of Patent: Mar. 31, 2026

(54) POWER MODULE

(71) Applicants: Hyundai Motor Company, Seoul
(KR); Kia Corporation, Seoul (KR)

(72) Inventors: Tae Hwa Kim, Hwaseong-Si (KR); **Jin
Myeong Yang, Seongnam-Si (KR); Je
Hwan Lee**, Seongnam-Si (KR)

(73) Assignees: Hyundai Motor Company, Seoul
(KR); Kia Corporation, Seoul (KR)

( * ) Notice: Subject to any disclaimer, the term of this
patent is extended or adjusted under 35
U.S.C. 154(b) by 421 days.

(21) Appl. No.: 18/373,427

(22) Filed: Sep. 27, 2023

(65) Prior Publication Data

US 2024/0353446 A1    Oct. 24, 2024

(30) Foreign Application Priority Data

Apr. 20, 2023    (KR) ......................... 10-2023-0051898

(51) Int. Cl.
| | |
|---|---|
| G01R 1/20 | (2006.01) |
| H01C 1/08 | (2006.01) |
| H01C 1/14 | (2006.01) |
| H01L 23/495 | (2006.01) |
| H01L 25/18 | (2023.01) |
| H02M 7/00 | (2006.01) |

(52) U.S. Cl.
CPC .............. G01R 1/203 (2013.01); H01C 1/08
(2013.01); H01C 1/14 (2013.01); H01L
23/49575 (2013.01); H01L 25/18 (2013.01);
H02M 7/003 (2013.01)

(58) Field of Classification Search
CPC ...................................................... G01R 1/203
USPC ......................................................... 257/536
See application file for complete search history.

(56) References Cited

U.S. PATENT DOCUMENTS

| | | | | |
|---|---|---|---|---|
| 7,145,254 | B2 * | 12/2006 | Hirano | ................ H01L 23/4334 |
| | | | | 257/796 |
| 11,121,055 | B2 | 9/2021 | Cheng et al. | |
| 2022/0068769 | A1 * | 3/2022 | Kim | ........................ H01L 23/16 |
| 2024/0421106 | A1 * | 12/2024 | Yang | ................ H01L 23/49844 |
| 2025/0169375 | A1 * | 5/2025 | Lim | ........................ H01L 24/48 |

FOREIGN PATENT DOCUMENTS

| | | |
|---|---|---|
| JP | 2019-079957 | 5/2019 |
| KR | 10-2065118 | 1/2020 |

* cited by examiner

*Primary Examiner* — Ajay Arora
(74) *Attorney, Agent, or Firm* — MORGAN, LEWIS &
BOCKIUS LLP

(57) ABSTRACT

A power module includes a first substrate and a second
substrate; a semiconductor chip; a resistor electrically con-
necting the first substrate and the second substrate while
being spaced from the semiconductor chip in the horizontal
direction, the resistor including a resistance value greater
than a resistance value of the metal layer; a first sensing lead
connected to a first end portion of the resistor; and a second
sensing lead connected to a second end portion of the
resistor.

19 Claims, 8 Drawing Sheets

FIG. 3C

——————► Power
– – – – –► Signal

POWER MODULE

CROSS-REFERENCE TO RELATED APPLICATION(S)

The present application claims priority to Korean Patent Application No. 10-2023-0051898, filed on Apr. 20, 2023, the entire contents of which is incorporated herein for all purposes by this reference.

BACKGROUND OF THE PRESENT DISCLOSURE

Field of the Present Disclosure

The present disclosure relates to a power module, and more specifically, to a power module configured for sensing a current applied through a resistor connecting substrates on both sides thereof.

Description of Related Art

In line with increasing interest in environmental issues, there has recently been increasing use of eco-friendly vehicles provided with an electric motor as a power source. Typical examples of eco-friendly vehicles, also referred to as electrified vehicles, include electric vehicles (EV) and hybrid electric vehicles (HEV).

Such an electrified vehicle has an inverter for converting DC power into AC power when the motor is driven, and the inverter typically includes one power module or multiple power modules each having a semiconductor chip configured to perform a switching function.

Meanwhile, to control the power conversion system of a vehicle including a power module, it is necessary to detect the current flowing through the power module. To the present end, a current sensor may be provided outside the power module, or a resistor (for example, a shunt resistor) may be provided inside the power module.

If a resistor (for example, a shunt resistor) is provided inside the power module, a large current flows through the resistor inside the power module, and it is thus necessary to appropriately adjust resulting heat generated by the resistor and formation of a current loop.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing a power module configured for detecting a current applied through a resistor connecting substrates on both sides thereof, improving sensing accuracy, and configured for reducing switching loss.

The technical subjects pursued in an exemplary embodiment of the present disclosure may not be limited to the above mentioned technical subjects, and other technical subjects which are not mentioned may be clearly understood, through the following descriptions, by those skilled in the art.

In accordance with an aspect, a power module according to an exemplary embodiment of the present disclosure includes: a first substrate and a second substrate each including an insulating layer and a metal layer, the first substrate and the second substrate being spaced apart in a vertical direction so that the metal layers of the first substrate and the second substrate face each other; a semiconductor chip disposed between the first substrate and the second substrate a resistor disposed between the first substrate and the second substrate to electrically connect the first substrate and the second substrate while being spaced from the semiconductor chip, the resistor including a resistance value greater than a resistance value of the metal layer; a first sensing lead connected to a first end portion of the resistor; and a second sensing lead connected to a second end portion of the resistor.

For example, a current may be applied to the second substrate from the outside thereof, and the applied current may successively flow through the second substrate, the semiconductor chip, and the first substrate, may flow in through one end portion of the resistor, may flow out through the other end portion of the resistor, and may be transferred to the second substrate.

For example, the first sensing lead and the second sensing lead may be connected to the second substrate.

For example, the power module according to an exemplary embodiment of the present disclosure may further include a connector configured so that a current in a state prior to passing through the resistor is transferred to the second substrate to which the first sensing lead is connected.

For example, the connector may extend in the vertical direction between the first substrate and the second substrate while being spaced from the resistor in a horizontal direction, the first substrate may include a first sensing pattern formed on a portion connected to one end portion of the resistor so that a current flows to the connector, and the second substrate may include a second sensing pattern formed to make electric conductance between the connector and the first sensing lead.

For example, the connector may extend between the first substrate and the second substrate in the vertical direction to be coupled to the resistor with an insulator interposed between the resistor and the connector so that the connector is electrically disconnected from the resistor.

For example, at least one of one end portion and the other end portion of the resistor may be electrically separated from the connector.

For example, the connector may extend in the horizontal direction from one end portion of the resistor toward the outside of the resistor to be bent toward the second substrate and connected to the second substrate.

For example, the connector may make no contact with the first substrate.

For example, the connector may further extend in the horizontal direction toward the inside of the resistor to overlap the resistor.

For example, the connector may include: a first connector extending in the horizontal direction from one end portion of the resistor toward the outside of the resistor to be bent toward the second substrate and connected to the second substrate; and a second connector extending in the horizontal direction from the other end portion of the resistor toward the outside of the resistor to be connected to the second substrate.

For example, the second connector may further extend in the horizontal direction from the other end portion of the resistor toward the inside of the resistor to overlap the resistor.

For example, the resistor may be inserted into at least one of the first substrate and the second substrate.

For example, the resistor may be inserted into the metal layer of at least one of the first substrate and the second substrate.

For example, the resistor may be made of a material including a temperature coefficient of resistance (TCR), an absolute value of which is equal to or less than a predetermined value.

According to various embodiments of the present disclosure described above, the current loop is comparatively reduced through a structure including a resistor connecting substrates on both sides, reducing loop inductance, and the switching loss of the power module is thus alleviated.

Furthermore, the space for containing a resistor is reduced, and the area of the substrate is thus reduced, reducing the material cost.

Furthermore, a smaller number of components are mounted inside the power module, improving the process yield.

In addition to the above-mentioned advantageous effects, heat generated by the resistor is dissipated, improving the accuracy of current sensing, and the controllability of the inverter configured by the power module is improved.

Advantageous effects obtainable from the present disclosure may not be limited to the above mentioned effects, and other effects which are not mentioned may be clearly understood, through the following descriptions, by those skilled in the art to which the present disclosure pertains.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

BRIEF DESCRIPTION OF THE DRAWINGS

FIG. 3A, FIG. 3B and FIG. 3C illustrate structures of resistors applicable to various exemplary embodiments of the present disclosure;

Figure 1:
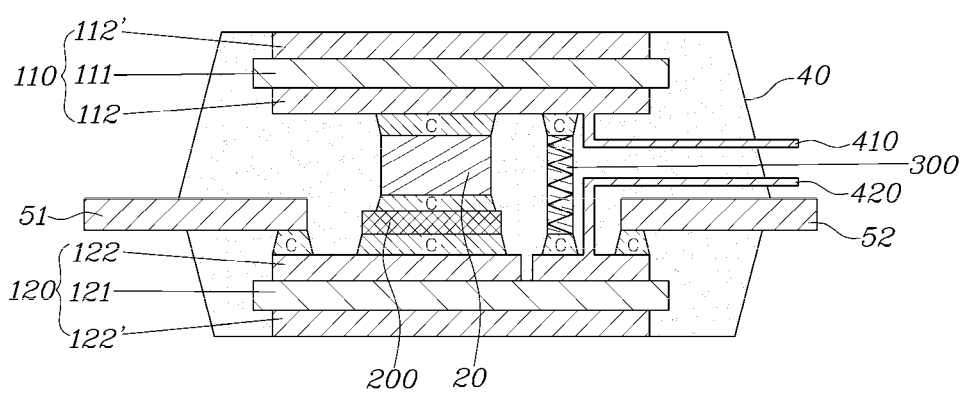
FIG. 1 schematically illustrates components of a power module applicable to various exemplary embodiments of the present disclosure and connectivity between respective components.

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to the same or equivalent parts of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

A specific structural or functional description of embodiments of the present disclosure set forth in the specification or application is provided merely for describing the exemplary embodiment of the present disclosure. Therefore, the exemplary embodiments of the present disclosure may be implemented in various forms, and the present disclosure should not be construed as being limited to the exemplary embodiments described in the specification or application.

Various changes and modifications may be made to the exemplary embodiments according to an exemplary embodiment of the present disclosure, and therefore various exemplary embodiments will be illustrated in the drawings and described in the specification or application. However, it should be understood that embodiments according to the concept of the present disclosure are not limited to the particular disclosed exemplary embodiments of the present disclosure, but the present disclosure includes all modifications, equivalents, and alternatives falling within the spirit and scope of the present disclosure.

Unless defined otherwise, all terms used herein, including technical and scientific terms, include the same meaning as those commonly understood by a person skilled in the art to which the present disclosure pertains. Such terms as those defined in a generally used dictionary may be interpreted to include the meanings equal to the contextual meanings in the relevant field of art, and are not to be interpreted to have ideal or excessively formal meanings unless clearly defined in an exemplary embodiment of the present disclosure.

Hereinafter, embodiments included in the present specification will be described in detail with reference to the accompanying drawings, and the same or similar elements are provided the same and similar reference numerals, so duplicate descriptions thereof will be omitted.

The terms "module" and "unit" used for the elements in the following description are provided or interchangeably used in consideration of only the ease of writing the specification, and do not have distinct meanings or roles by themselves.

In describing the exemplary embodiments included in the present specification, when the detailed description of the relevant known technology is determined to unnecessarily obscure the gist of the present disclosure, the detailed description may be omitted. Furthermore, the accompanying drawings are provided only for easy understanding of the exemplary embodiments included in the present specification, and the technical spirit included herein is not limited to the accompanying drawings, and it should be understood that all changes, equivalents, or substitutes thereof are included in the spirit and scope of the present disclosure.

Terms including an ordinal number such as "first", "second", or the like may be used to describe various elements, but the elements are not limited to the terms. The above terms are used only for distinguishing one element from another element.

In the case where an element is referred to as being "connected" or "coupled" to any other element, it should be understood that another element may be provided therebetween, as well as that the element may be directly connected or coupled to the other element. In contrast, in the case where an element is "directly connected" or "directly coupled" to any other element, it should be understood that no other element is present therebetween.

A singular expression may include a plural expression unless they are definitely different in a context.

As used herein, the expression "include" or "have" are intended to specify the existence of mentioned features, numbers, steps, operations, elements, components, or combinations thereof, and should be construed as not precluding the possible existence or addition of one or more other features, numbers, steps, operations, elements, components, or combinations thereof.

A unit or a control unit included in names such as a motor control unit (MCU) and a hybrid control unit (HCU) is merely a term widely used for naming a controller configured to control a specific function of a vehicle, but does not mean a generic function unit.

A controller may include a communication device configured to communicate with a sensor or another control unit, a memory configured to store an operation system, a logic command, or input/output information, and at least one processor configured to perform determination, calculation, decision or the like which are required for responsible function controlling.

Embodiments of the present disclosure propose a structure of a power module including a resistor 300 electrically connecting a first substrate 110 and a second substrate 120, reducing a current loop, and decreasing the space necessary to mount the resistor 300.

The current loop may be defined as a path along which a current applied to the power module from the outside thereof is again output to the outside through respective components inside the power module. In the following description, a path of movement of a large current inside the power module may be referred to as a power loop, and a path of movement for sensing a current inside the power module may be referred to as a signal loop.

Hereinafter, components of a power module applicable to various exemplary embodiments of the present disclosure and connectivity between respective components will be described with reference to FIG. 1.

FIG. 1 schematically illustrates components of a power module applicable to various exemplary embodiments of the present disclosure and connectivity between respective components.

Referring to FIG. 1, various embodiments of the present disclosure may include a first substrate 110, a second substrate 120, a semiconductor chip 200, a resistor 300, a first sensing lead 410, and a second sensing lead 420, and may further include a spacer 20, an encapsulator 40, and multiple power leads 51 and 52. However, FIG. 1 mainly illustrates components related to the present disclosure, and it is obvious that an actual power module may be implemented to include more components or fewer components.

Hereinafter, prior to describing the connectivity, respective components will be described in detail.

The first substrate 110 and the second substrate 120 include insulating layers 111 and 121 and metal layers 112 and 122, respectively, and respective metal layers 112 and 122 are disposed to face each other while being spaced from each other in the vertical direction thereof.

Each of the first substrate 110 and the second substrate 120 may be referred to as an upper substrate or a lower substrate, depending on the which is disposed above the other, and it will be assumed in the following description that the first substrate 110 is an upper substrate, the second substrate 120 is a lower substrate. However, the present assumption is only for convenience of description, the disposition of the first substrate 110 and the second substrate 120 with regard to each other is not limited thereto, and embodiments of the present disclosure are also applicable to a case in which the first substrate 110 and the second substrate 120 are disposed in the opposite vertical orientation.

The insulating layers 111 and 121 of respective substrate 110 and 120 may be configured to electrically insulate the inside and outside of the power module, and the metal layers 112 and 122 thereof may be configured for electric conductance inside the power module and may form a pattern, forming electric connectivity inside the power module.

The first substrate 110 and the second substrate 120 form a double-sided structure so that heat generated inside the power module is transferred upwards/downwards and to cool the same (that is, a double-sided cooling scheme is applicable). This provides a higher cooling efficiency than a single-sided cooling scheme. The improved cooling efficiency lowers the operating temperature of the power module, improving operating stability.

Furthermore, to improve the cooling efficiency, additional metal layers 112' and 122' may be disposed toward the outside of the power module, in addition to the metal layers 112 and 122 disposed on surfaces of the insulating layers 111 and 121 facing the inside of the power module. The additional metal layers 112' and 122' may dissipate heat generated inside the power module to the outside through heat exchange the with the outside thereof, cooling the power module.

Moreover, to obtain a further improved cooling efficiency, cooling channels may be connected to the outside of the additional metal layers 112' and 122' so that a refrigerant flows therethrough, and a thermal interface material (TIM) may be applied in the space between the additional metal layers 112' and 122' and the cooling channels so that heat is transferred therebetween.

Meanwhile, respective insulating layers 111 and 121 may be made of ceramic, for example, and respective metal layers 112 and 122 and additional metal layers 112' and 122' may be made of copper (Cu), for example. In the instant case, the first substrate 110 and the second substrate 120 may be implemented in an active metal brazed (AMB) type or in a direct bonded copper (DBC) type.

Meanwhile, the semiconductor chip 200 is disposed between the first substrate 110 and the second substrate 120.

The semiconductor chip 200 may be connected to one of the first substrate 110 and the second substrate 120 through a bonding agent C and coupled to the other through a spacer 20. The spacer 20 may also be referred to as a chip spacer in that the semiconductor chip 200 is connected to the first substrate 110 and the second substrate 120 therethrough. Although FIG. 1 illustrates the semiconductor chip 200 bonded to the second substrate 120 or lower substrate, but the disposition of the semiconductor chip 200 is not necessarily limited thereto.

The semiconductor chip 200 may be turned ON/OFF according to a switching signal, and the ON/OFF state determines whether a current flows between the upper/lower portions of the semiconductor chip 200.

Meanwhile, the semiconductor chip 200 may be implemented as a switching element such as an insulated gate bipolar transistor (IGBT) or a metal-oxide-semiconductor field-effect transistor (MOSFET), for example, and may include silicon (Si) or silicon carbide (SiC).

The resistor 300 is disposed between the first substrate 110 and the second substrate 120 to electrically connect the first substrate 110 and the second substrate 120 while being spaced from the semiconductor chip 200, and includes a larger resistance value than the metal layers 112 and 122.

For example, the resistor 300 may extend in the vertical direction between the first substrate 110 and the second substrate 120, electrically connecting the first substrate 110 and the second substrate 120, and may be spaced from the semiconductor chip 200 in the horizontal direction thereof.

As the resistor 300 electrically connects the first substrate 110 and the second substrate 120, a large current can flow through the resistor 300 inside the power module. Accordingly, a separate component (for example, a via spacer) provided between the first substrate 110 and the second substrate 120 to form a path of electric conductance between the first substrate 110 and the second substrate 120 may be omitted, and a current loop through which a large current flows may be simplified.

The resistor 300 includes a resistance value equal to or greater than a predetermined value to be distinguished from noise, and may include a resistance value corresponding to 100 times that of copper (Cu) or larger, for example.

Meanwhile, the resistor 300 may be made of a material including a temperature coefficient of resistance (TCR), an absolute value of which is equal to or less than a predetermined value. The smaller the absolute value of the TCR, the smaller the change amount in the resistance value in response to a temperature change, improving the accuracy of temperature sensing by the power module.

The first sensing lead 410 and the second sensing lead 420 are connected to one end portion and the other end portion of the resistor 300, respectively.

When a current inside the power module passes through the resistor 300, a voltage drop occurs across the first substrate 110 and the second substrate 120, which are connected to both end portions of the resistor 300, respectively, and an electric potential across both end portions of the resistor 300 may be obtained through the first sensing lead 410 and the second sensing lead 420 which are connected to both end portions of the resistor 300, respectively. This makes it possible to measure the difference in electric potential (voltage) across both end portions of the resistor 300, and the measured voltage may be used to detect the current flowing inside the power module.

For example, the first sensing lead 410 and the second sensing lead 420 may be connected to a controller configured to control the power module or an inverter including the power module, such as a motor controller. Accordingly, the controller may obtain electric potentials before and after passing through the resistor 300 from the first sensing lead 410 and the second sensing lead 420, respectively (that is, electric potentials at one end portion and at the other end), and may be configured to determine the current value applied to the power module based on the difference in electric potential across both end portions and the resistance value of the resistor 300. As the resistance value of the resistor 300, a value applied measured before a current is applied to the power module may be used.

The encapsulator 40 may be configured to protect components inside the power module from the outside and to insulate the inside and outside of the power module from each other. For example, the encapsulator may be made of an epoxy molding compound (EMC).

The multiple power leads 51 and 52 may be connected to at least one of the first substrate 110 and the second substrate 120 so that a current may be input thereto from the outside or output to the outside thereof, and may operate as a P terminal, an N terminal, and an O terminal, respectively.

Referring to FIG. 1, for example, the first power lead 51 may operate as a P terminal, and the second power lead 52 may operate as an O terminal. A current may be input through the first power lead 51, transferred to the second substrate 120, transferred to the second power lead 52 via the first substrate 110, the semiconductor chip 200, the resistor 300 and the like, and then output to the outside thereof. This will be described later in more detail with reference to FIG. 2.

Furthermore, respective components described above may be coupled through a bonding agent C, and solders may be used as the bonding agent C for electric conductance, for example.

Meanwhile, FIG. 1 schematically illustrates components of a power module applicable to various exemplary embodiments of the present disclosure and connectivity between respective components to understand the flow of current inside the power module, and the detailed configuration and three-dimensional structure of the power module are not necessarily limited thereto. For example, the first sensing lead 410 and the second sensing lead 420, although illustrated in FIG. 1 as being connected to the first substrate 110 and the second substrate 120, respectively, may be both connected to the first substrate 110 or both connected to the second substrate 120.

If the first sensing lead 410 and the second sensing lead 420 are both connected to the second substrate 120, various embodiments of the present disclosure may further include a connector 600 so that a current in a state prior to passing through the resistor 300 is transferred to the second substrate 120. This will be described later in more detail with reference to FIG. 4A to FIG. 7B.

The flow of current according to the configuration of respective components of a power module applicable to various exemplary embodiments of the present disclosure and connectivity therebetween, described with reference to FIG. 1, will now be described with reference to FIG. 2.

Figure 2:
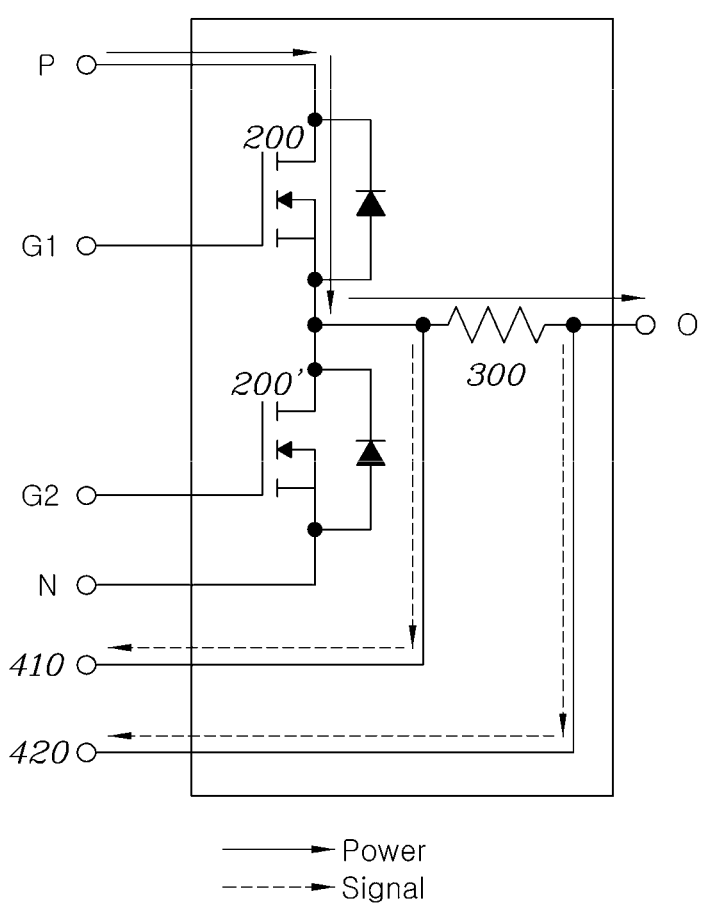
FIG. 2 illustrates the flow of current inside a power module applicable to various exemplary embodiments of the present disclosure.

FIG. 2 illustrates the flow of current inside a power module applicable to various exemplary embodiments of the present disclosure.

FIG. 2 is a circuit diagram illustrating the flow of current when a resistor for current sensing is provided inside a power module, which is assumed to have components described above with reference to FIG. 1.

Referring to FIG. 2, according to various exemplary embodiments of the present disclosure, a current is applied to the second substrate 120 from the outside thereof through the first power lead 51 (P terminal). A power loop may be formed so that the applied current successively flows through the second substrate 120, the semiconductor chip 200, and the first substrate 110 and is then transferred to the outside through the second power lead 52 (O terminal).

Meanwhile, a signal loop may be formed independently of the power loop so that the current flowing through the power module may be detected through the first sensing lead 410 and the second sensing lead 420.

According to various exemplary embodiments of the present disclosure, a current is applied to the second substrate 120 from the outside thereof through the first power lead 51 (P terminal). A signal loop may be formed so that the applied current successively flows through the second substrate 120, the semiconductor chip 200, and the first substrate 110, flows in through one end portion of the resistor 300, flows out through the other end portion of the resistor 300, and is transferred to the second substrate.

In the instant case, the first sensing lead 410 is connected to one end portion of the resistor 300, making it possible to obtain the electric potential before passing through the resistor 300 along the signal loop, and the second sensing lead connected to a second end portion of the resistor 300 makes it possible to obtain the electric potential after passing through the resistor 300.

Hereinafter, the structures of a resistor 300 applicable to various exemplary embodiments of the present disclosure will be described with reference to FIG. 3A and FIG. 3B.

Figure 3A:
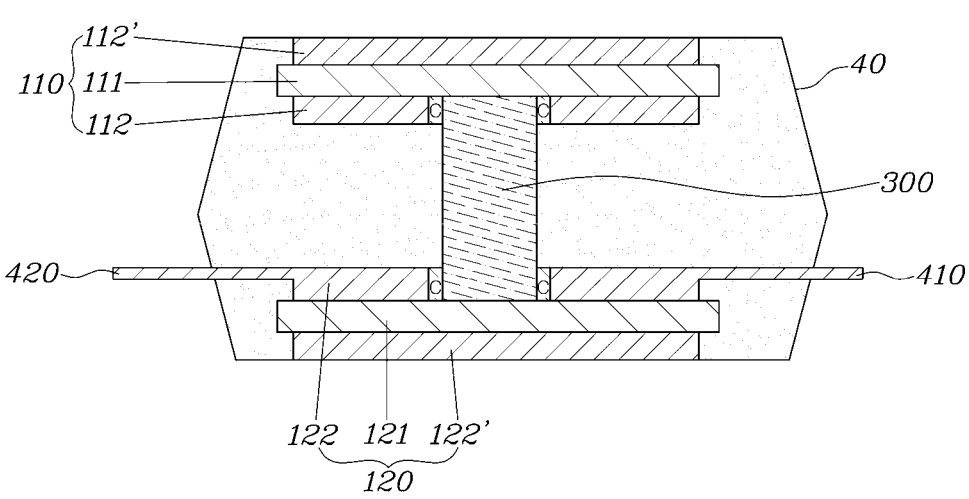
Figure 3B:
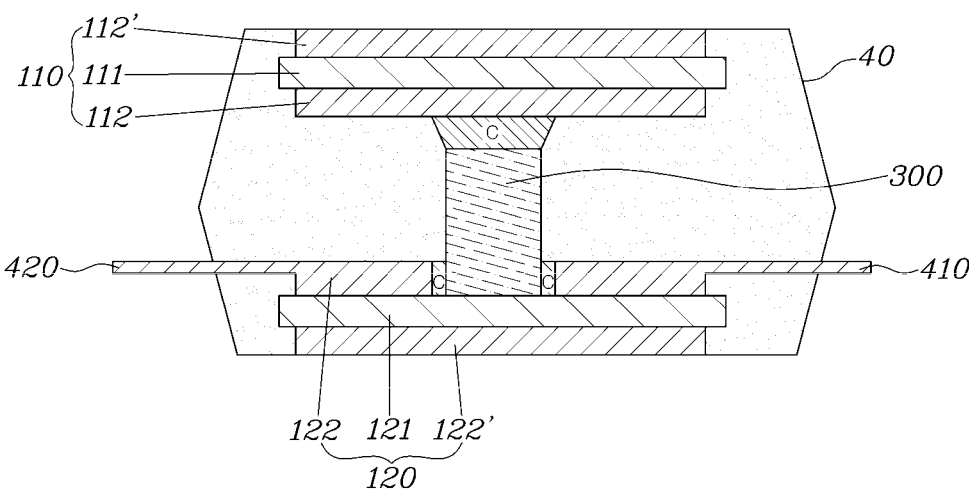
Figure 3C:
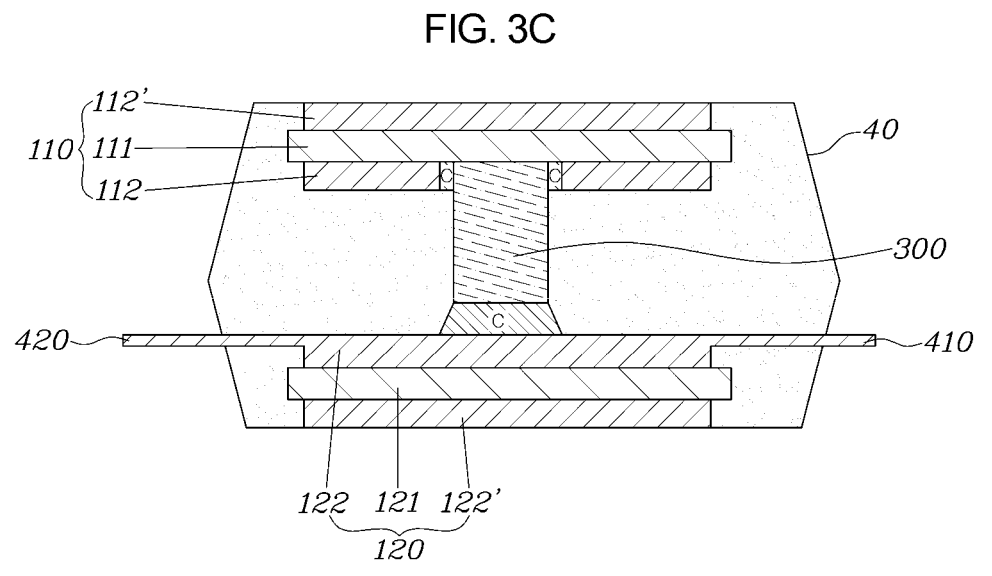

FIG. 3A, FIG. 3B and FIG. 3C illustrate structures of resistors applicable to various exemplary embodiments of the present disclosure.

Referring to FIG. 3A, FIG. 3B and FIG. 3C, according to various exemplary embodiments of the present disclosure, the resistor 300 may be inserted into at least one of a first substrate 110 and a second substrate 120, and may be inserted into metal layers 112 and 122 of at least one of the first substrate 110 and the second substrate 120.

For example, as illustrated in FIG. 3A, the resistor 300 may be inserted into the first substrate 110 and the second substrate 120 and coupled through a bonding agent C.

Alternatively, as illustrated in FIG. 3B and FIG. 3C, the resistor 300 may be inserted into only one of the first substrate 110 and the second substrate 120 and coupled through a bonding agent C.

If the resistor 300 is inserted into at least one of the first substrate 110 and the second substrate 120, the resistant influence caused by the vertical thickness of the bonding agent C may be alleviated, improving the accuracy of current sensing.

Hereinafter, various embodiments of the present disclosure will be described with reference to FIG. 4A to FIG. 7B.

Figure 4A:
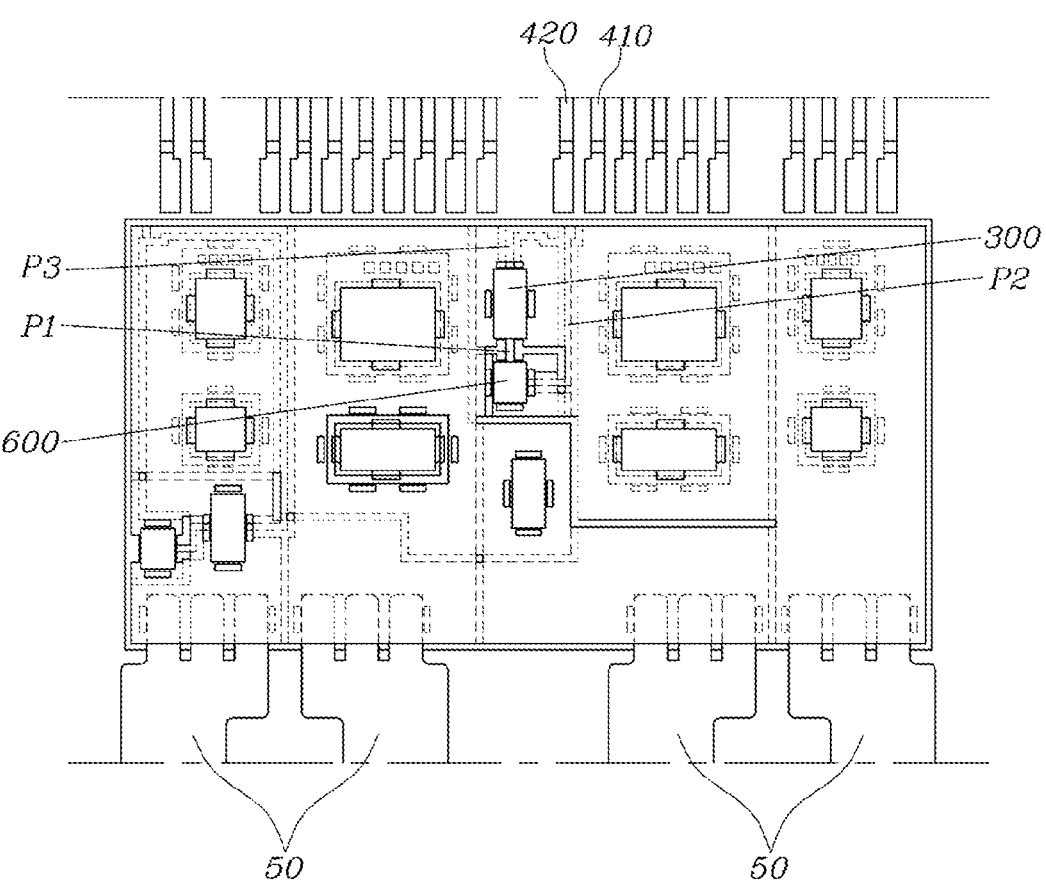
FIG. 4A and FIG. 4B illustrate a power module according to various exemplary embodiments of the present disclosure.
Figure 4B:
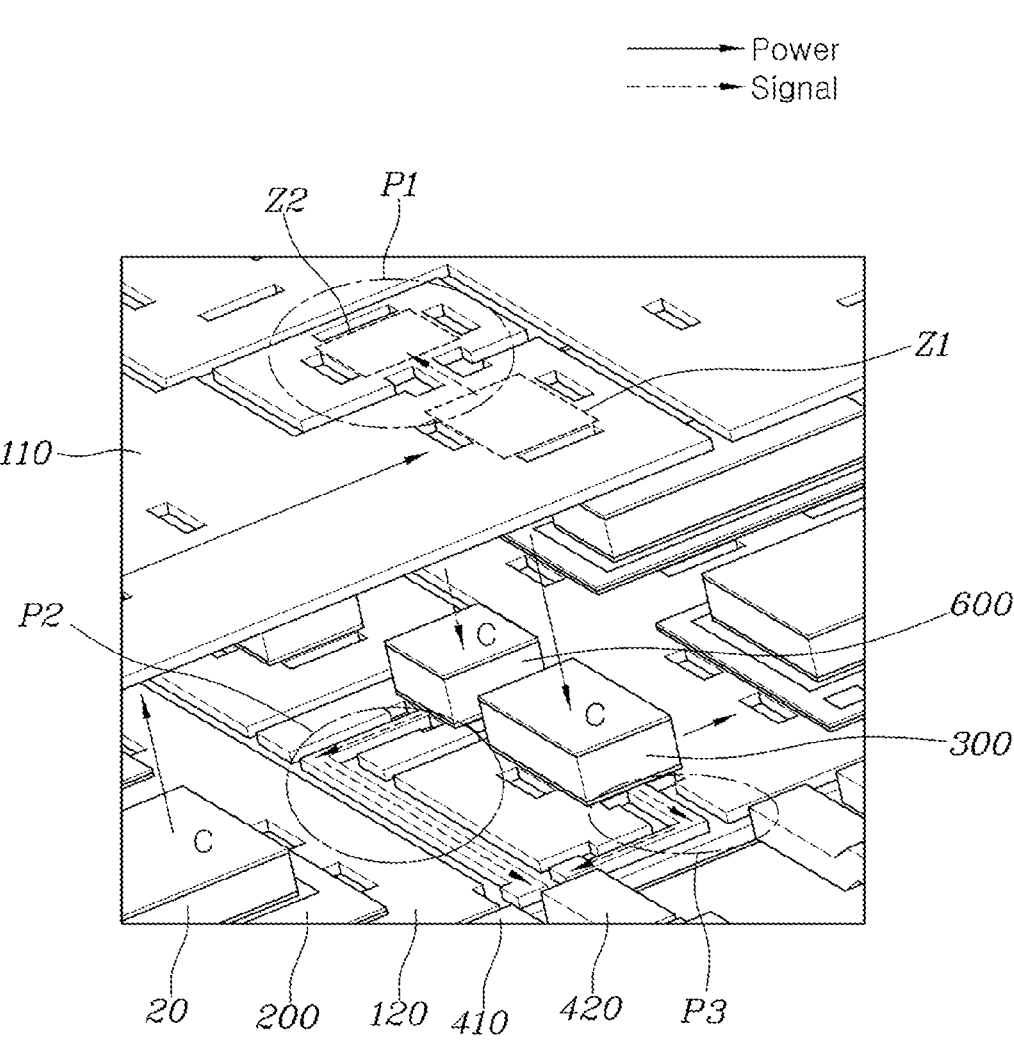

FIG. 4A and FIG. 4B illustrate a power module according to various exemplary embodiments of the present disclosure.

FIG. 4A is a top view of the power module according to the various exemplary embodiments of the present disclosure, and FIG. 4B is a partial lateral view of the power module according to the various exemplary embodiments of the present disclosure, wherein the first substrate 110 and the second substrate 120 are separately illustrated one above the other, for convenience of description.

Referring to FIG. 4A and FIG. 4B together, according to the various exemplary embodiments of the present disclosure, the first sensing lead 410 and the second sensing lead 420 are both connected to the second substrate 120, and a connector 600 is provided so that a current in a state prior to passing through a resistor may be transferred to the second substrate 120.

The connector 600 may be formed to extend in the vertical direction between the first substrate 110 and the second substrate 120 while being spaced from the resistor 300 in the horizontal direction thereof. The first substrate 110 may include a first sensing pattern P1 formed on a part connected to one end portion of the resistor 300 so that a current flows to the connector 600, and the second substrate 120 may include a second sensing pattern P2 formed so that a current flows between the connector and the first sensing lead 410.

A current applied to the second substrate 120 through one of multiple power leads 50 is transferred to the first substrate 110 via the semiconductor chip 220 and the spacer 20.

Thereafter, the current transferred to the first substrate 110 is transferred to the connector 600 disposed under a connector bonding zone Z2, without going through the resistor 300, through the first sensing pattern P1, and reaches the first sensing lead 410 via the connector 600 and the second sensing pattern P2 without passing through the resistor 300.

At the same time, the current transferred to the first substrate 110 is transferred to the resistor 300 disposed under a resistor bonding zone Z1, passes through the resistor 300, and reaches the second sensing lead 420 via the third sensing pattern P3 formed on the second substrate 120.

The second sensing pattern P2 and the third sensing pattern P3 are formed on the second substrate 120 independently of each other for electric conductance with the first sensing lead 410 and the second sensing lead 420, respectively.

Meanwhile, the first sensing lead 410 and the second sensing lead 420 may be electrically connected to the second sensing pattern P2 and the third sensing pattern P3 through wire bonding or the like, respectively.

The connector 600 described above makes it possible to implement a structure in which the first sensing lead 410 and the second sensing lead 420 are connected to the same substrate at the same height according to the various exemplary embodiments of the present disclosure, accomplishing process convenience.

Figure 5:
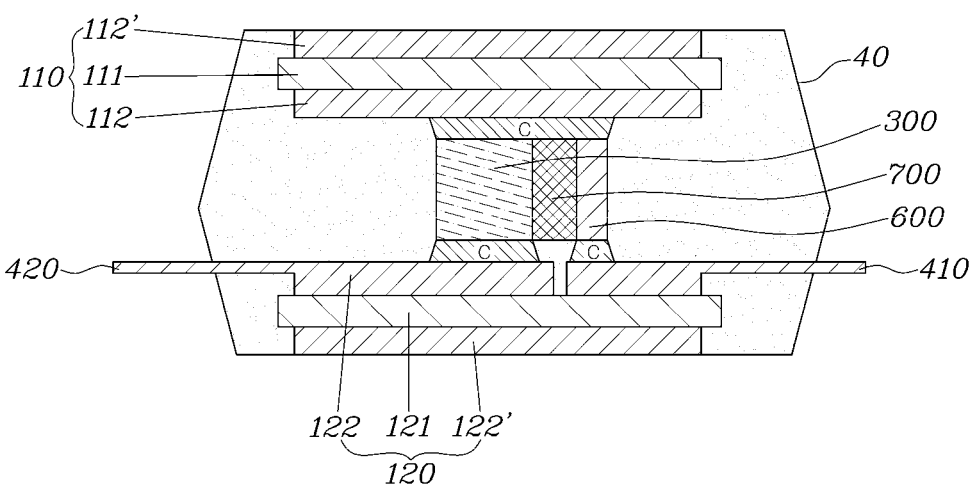
FIG. 5 illustrates a power module according to various exemplary embodiments of the present disclosure.

FIG. 5 illustrates a power module according to various exemplary embodiments of the present disclosure.

Referring to FIG. 5, according to the various exemplary embodiments of the present disclosure, a connector 600 may be formed to extend in the vertical direction between a first substrate 110 and a second substrate 120, and may be coupled to a resistor 300 with an insulator 700 interposed therebetween to electrically disconnect the same from the resistor 300.

In the instant case, at least one end portion and the other end portion of the resistor 300 may be electrically disconnected from the connector 600. Accordingly, currents before and after passing through the resistor 300 are separately transferred to the second substrate 120, and the difference in electric potential before and after passing through the resistor 300 may be obtained through a first sensing lead 410 and a second sensing lead 420 connected to the second substrate 120.

According to the various exemplary embodiments of the present disclosure, a unit in which the resistor 300 and the connector 600 are connected is separately produced and then stacked between the first substrate 110 and the second substrate 120, reducing the difficulty in assembling the power module.

Furthermore, the first sensing lead 410 and the second sensing lead 420 are connected to the same substrate at the same height, and the present structure accomplishes process convenience.

Figure 6A:
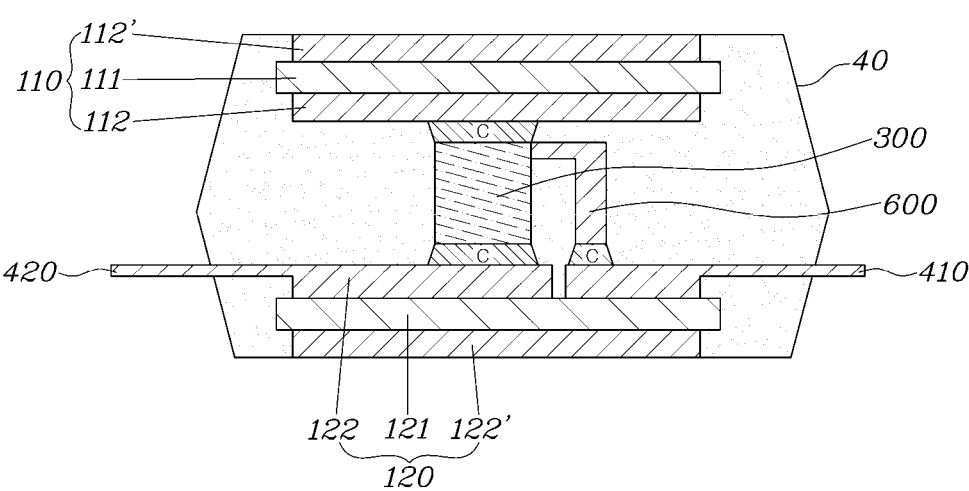
FIG. 6A and FIG. 6B illustrate a power module according to various exemplary embodiments of the present disclosure.
Figure 6B:
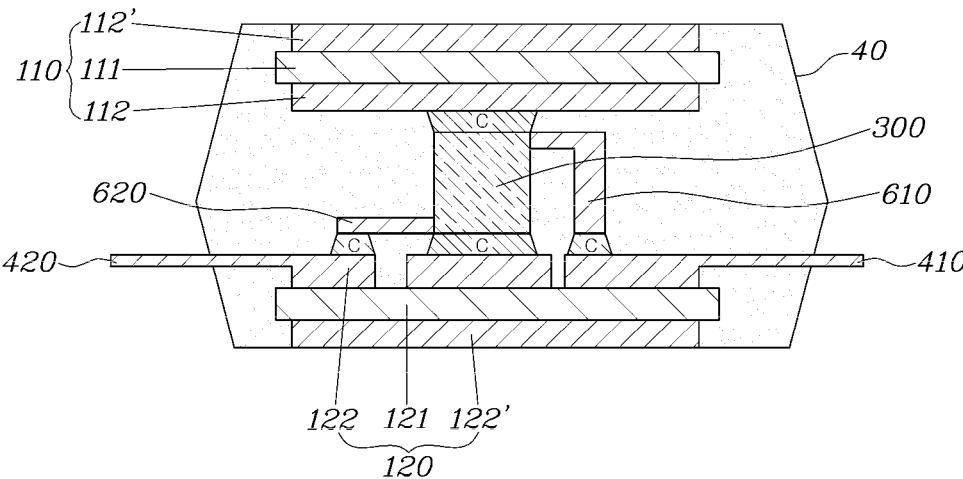

FIG. 6A and FIG. 6B illustrate a power module according to various exemplary embodiments of the present disclosure.

Referring to FIG. 6A, a connector 600 may extend from one end portion of a resistor 300 toward the outside of the resistor 300 in the horizontal direction, and may be bent toward a second substrate 120 and connected to the second substrate 120.

In the instant case, the connector 600 may contact with the second substate 120 and connect thereto, and may not contact with the first substrate 110.

Meanwhile, referring to FIG. 6B, the connector 600 may include a combination of a first connector 610 which extends from one end portion of the resistor 300 toward the outside of the resistor 300 in the horizontal direction, and which is bent toward the second substrate 120 and connected to the second substrate 120, and a second connector 620 extending from the other end portion of the resistor 300 toward the outside of the resistor 300 in the horizontal direction to be connected to the second substrate 120.

In the instant case, the second substrate 120 may be formed to insulate parts of connection between the first sensing lead 410 and the first connector 610 and parts of connection between the second sensing lead 420 and the second connector 620.

According to the various exemplary embodiments of the present disclosure, a unit in which the resistor 300 and the connector 600 are connected is separately produced and then stacked between the first substrate 110 and the second substrate 120, reducing the difficulty in assembling the power module.

Furthermore, in the instant case, the first sensing lead 410 and the second sensing lead 420 may be formed through a substrate.

Figure 7A:
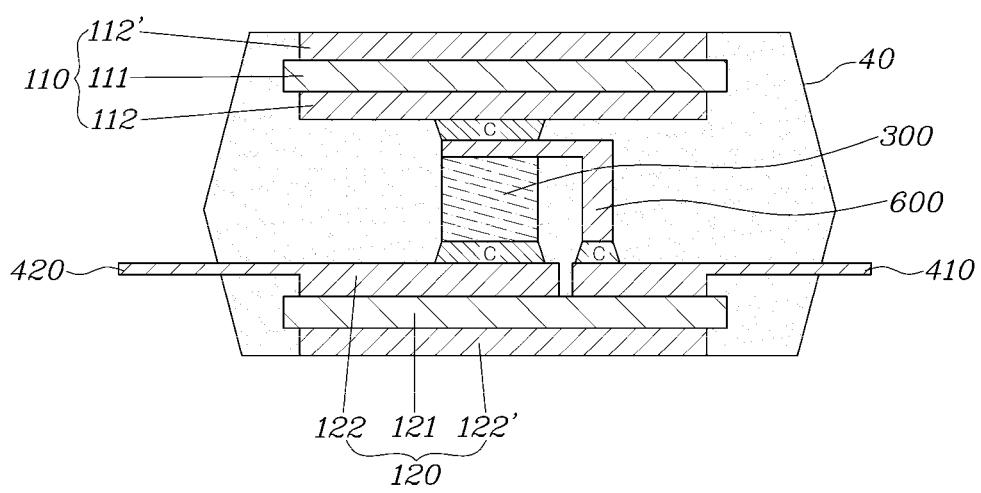
FIG. 7A and FIG. 7B illustrate a power module according to various exemplary embodiments of the present disclosure.
Figure 7B:
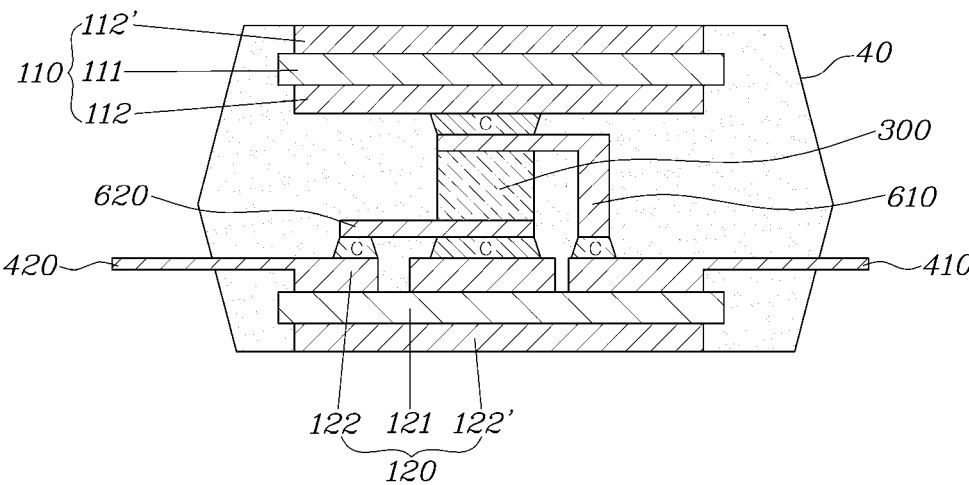

FIG. 7A and FIG. 7B illustrate a power module according to various exemplary embodiments of the present disclosure.

Compared with the various exemplary embodiments of FIGS. 6A and 6B described above, the connector 600 in FIG. 7A and FIG. 7B may further extend toward the inside of the resistor 300 in the horizontal direction to overlap the resistor 300, and may be shaped to cover the upper portion of one end portion of the resistor 300 and the lower portion of the other end portion thereof.

According to the various exemplary embodiments of the present disclosure, a unit in which the resistor 300 and the connector 600 are connected is separately produced and then stacked between the first substrate 110 and the second substrate 120, reducing the difficulty in assembling the power module.

Furthermore, in the instant case, the first sensing lead 410 and the second sensing lead 420 may be formed through a substrate.

According to various embodiments of the present disclosure described above, the current loop is comparatively reduced through a structure including a resistor connecting substrates on both sides, reducing loop inductance, and the switching loss of the power module is thus alleviated.

Furthermore, the space for including a resistor is reduced, and the area of the substrate is thus reduced, reducing the material cost.

Furthermore, a smaller number of components are mounted inside the power module, improving the process yield.

In addition to the above-mentioned advantageous effects, heat generated by the resistor is dissipated, improving the accuracy of current sensing, and the controllability of the inverter configured by the power module is improved.

Furthermore, the term related to a control device such as "controller", "control apparatus", "control unit", "control device", "control module", or "server", etc refers to a hardware device including a memory and a processor configured to execute one or more steps interpreted as an algorithm structure. The memory stores algorithm steps, and the processor executes the algorithm steps to perform one or more processes of a method in accordance with various exemplary embodiments of the present disclosure. The control device according to exemplary embodiments of the present disclosure may be implemented through a nonvolatile memory configured to store algorithms for controlling operation of various components of a vehicle or data about software commands for executing the algorithms, and a processor configured to perform operation to be described above using the data stored in the memory. The memory and the processor may be individual chips. Alternatively, the memory and the processor may be integrated in a single chip. The processor may be implemented as one or more processors. The processor may include various logic circuits and operation circuits, may be configured to process data according to a program provided from the memory, and may be configured to generate a control signal according to the processing result.

The control device may be at least one microprocessor operated by a predetermined program which may include a series of commands for carrying out the method included in the aforementioned various exemplary embodiments of the present disclosure.

The aforementioned invention can also be embodied as computer readable codes on a computer readable recording medium. The computer readable recording medium is any data storage device that can store data which may be thereafter read by a computer system and store and execute program instructions which may be thereafter read by a computer system. Examples of the computer readable recording medium include Hard Disk Drive (HDD), solid state disk (SSD), silicon disk drive (SDD), read-only memory (ROM), random-access memory (RAM), CD-ROMs, magnetic tapes, floppy discs, optical data storage devices, etc and implementation as carrier waves (e.g., transmission over the Internet). Examples of the program instruction include machine language code such as those generated by a compiler, as well as high-level language code which may be executed by a computer using an interpreter or the like.

In various exemplary embodiments of the present disclosure, each operation described above may be performed by a control device, and the control device may be configured by a plurality of control devices, or an integrated single control device.

In various exemplary embodiments of the present disclosure, the memory and the processor may be provided as one chip, or provided as separate chips.

In various exemplary embodiments of the present disclosure, the scope of the present disclosure includes software or machine-executable commands (e.g., an operating system, an application, firmware, a program, etc.) for enabling operations according to the methods of various embodiments to be executed on an apparatus or a computer, a non-transitory computer-readable medium including such software or commands stored thereon and executable on the apparatus or the computer.

In various exemplary embodiments of the present disclosure, the control device may be implemented in a form of hardware or software, or may be implemented in a combination of hardware and software.

Furthermore, the terms such as "unit", "module", etc. included in the specification mean units for processing at least one function or operation, which may be implemented by hardware, software, or a combination thereof.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The term "and/or" may include a combination of a plurality of related listed items or any of a plurality of related listed items. For example, "A and/or B" includes all three cases such as "A", "B", and "A and B".

In the present specification, unless stated otherwise, a singular expression includes a plural expression unless the context clearly indicates otherwise.

In exemplary embodiments of the present disclosure, "at least one of A and B" may refer to "at least one of A or B" or "at least one of combinations of at least one of A and B". Furthermore, "one or more of A and B" may refer to "one or more of A or B" or "one or more of combinations of at least one of A and B".

In the exemplary embodiment of the present disclosure, it should be understood that a term such as "include" or "have" is directed to designate that the features, numbers, steps, operations, elements, parts, or combinations thereof described in the specification are present, and does not preclude the possibility of addition or presence of one or more other features, numbers, steps, operations, elements, parts, or combinations thereof.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described in order to explain certain principles of the invention and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. A power module comprising:
a first substrate and a second substrate each including an insulating layer and a metal layer, the first substrate and the second substrate being spaced apart in a vertical direction so that the metal layers of the first substrate and the second substrate face each other;
a semiconductor chip disposed between the first substrate and the second substrate;
a resistor disposed between the first substrate and the second substrate to electrically connect the first substrate and the second substrate while being spaced from the semiconductor chip, the resistor including a resistance value greater than a resistance value of the metal layer;
a first sensing lead connected to a first end portion of the resistor; and
a second sensing lead connected to a second end portion of the resistor.

2. The power module of claim 1,
wherein a current is applied to the second substrate from the outside thereof, and
wherein the applied current successively flows through the second substrate, the semiconductor chip, and the first substrate, flows into through the first end portion of the resistor, flows out through the second end portion of the resistor, and is transferred to the second substrate.

3. The power module of claim 2, wherein the first sensing lead and the second sensing lead are connected to the first substrate and the second substrate, respectively.

4. The power module of claim 3, wherein the first sensing lead and the second sensing lead are disposed between the first substrate and the second substrate in a horizontal direction.

5. The power module of claim 2, wherein the first sensing lead and the second sensing lead are connected to the second substrate.

6. The power module of claim 5, further including a connector configured so that the current in a state prior to passing through the resistor is transferred to the second substrate to which the first sensing lead is connected.

7. The power module of claim 6,
wherein the connector extends in the vertical direction between the first substrate and the second substrate while being spaced from the resistor in a horizontal direction,
wherein the first substrate includes a first sensing pattern formed on a portion connected to the first end portion of the resistor so that the current flows to the connector, and
wherein the second substrate includes a second sensing pattern formed to make electric conductance between the connector and the first sensing lead.

8. The power module of claim 6, wherein the connector extends between the first substrate and the second substrate in the vertical direction to be coupled to the resistor with an insulator interposed between the resistor and the connector so that the connector is electrically disconnected from the resistor.

9. The power module of claim 6, wherein at least one of the first end portion and the second end portion of the resistor is electrically separated from the connector.

10. The power module of claim 6, wherein the connector extends in the horizontal direction from the first end portion of the resistor toward the outside of the resistor to be bent toward the second substrate and connected to the second substrate.

11. The power module of claim 10, wherein the connector makes no contact with the first substrate.

12. The power module of claim 10, wherein the connector further extends in the horizontal direction toward the inside of the first end portion of the resistor to overlap the resistor.

13. The power module of claim 10, wherein the connector includes:
a first connector extending in a horizontal direction from the first end portion of the resistor toward the outside of the resistor to be bent toward the second substrate and connected to the second substrate; and
a second connector extending in the horizontal direction from the second end portion of the resistor toward the outside of the resistor to be connected to the second substrate.

14. The power module of claim 13, wherein the first connector further extends in the horizontal direction toward the inside of the first end portion of the resistor to overlap the resistor.

15. The power module of claim 14, wherein the second connector further extends in the horizontal direction from the second end portion of the resistor toward the inside of the second end portion of the resistor to overlap the resistor.

16. The power module of claim 13, wherein the second connector further extends in the horizontal direction from the second end portion of the resistor toward the inside of the second end portion of the resistor to overlap the resistor.

17. The power module of claim 2, wherein the resistor is inserted into at least one of the first substrate and the second substrate.

18. The power module of claim 17, wherein the resistor is inserted into the metal layer of the at least one of the first substrate and the second substrate.

19. The power module of claim 1, wherein the resistor is made of a material including a temperature coefficient of resistance (TCR), an absolute value of which is equal to or less than a predetermined value.

\* \* \* \* \*